(12) United States Patent
Johnson et al.

(10) Patent No.: US 6,638,080 B2
(45) Date of Patent: Oct. 28, 2003

(54) INTEGRATED BALL GRID ARRAY-PIN GRID ARRAY-FLEX LAMINATE TEST ASSEMBLY

(75) Inventors: Kenneth W Johnson, Colorado Springs, CO (US); Brent A. Holcombe, Bellingham, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/764,551

(22) Filed: Jan. 18, 2001

(65) Prior Publication Data

US 2003/0003780 A1 Jan. 2, 2003

(51) Int. Cl.[7] .............................................. G01R 31/02
(52) U.S. Cl. ....................................................... 439/77
(58) Field of Search ................................ 324/755, 765; 439/67, 77

(56) References Cited

U.S. PATENT DOCUMENTS

| | | | | |
|---|---|---|---|---|
| 4,912,401 A | * | 3/1990 | Nady, II et al. ............ | 324/755 |
| 4,997,377 A | * | 3/1991 | Goto | |
| 5,460,531 A | * | 10/1995 | Vivio ........................... | 439/70 |
| 5,859,538 A | * | 1/1999 | Self | |
| 5,896,037 A | * | 4/1999 | Kudla et al. ................. | 324/755 |
| 6,144,559 A | * | 11/2000 | Johnson ....................... | 361/760 |

* cited by examiner

Primary Examiner—Neil Abrams
(74) Attorney, Agent, or Firm—Regan L. Trumper

(57) ABSTRACT

An integrated probe assembly provides the capability to test integrated circuit (IC) packages mounted onto ball grid arrays. The present invention comprises an unsealed BGA socket (102), nail head pins (107) which can be inserted flush into a pin carrier to produce a PGA header (103), a Flex circuit assembly comprising a piece of flexible circuit (104) with various passive resistors and connectors attached and solder preforms (113) used to solder the flex assembly to the pin grid array. Matched impedance connectors (105) are attached at an end of the flexible circuit.

7 Claims, 2 Drawing Sheets

INTEGRATED BALL GRID ARRAY-PIN GRID ARRAY-FLEX LAMINATE TEST ASSEMBLY

BACKGROUND

The present invention relates generally to electronic test instruments and more particularly to a test probe assembly for electrically connecting a ball grid array surface mount package to an electronic measurement device.

Ball grid array (BGA) has become the package of choice in the surface mount technology arena. BGA's offer many advantages over standard fine-pitch surface mount and pin grid array technologies. These advantages include reduced placement problems since BGAs are self-centering, reduced handling issues because there are no leads to damage, lower profile and higher interconnect density. There is, however, a significant drawback with BGA technology: the lack of established BGA test accessories and procedures.

Electronic test instruments (e.g., oscilloscope, logic analyzer, emulator) are used to analyze various electrical aspects of the IC including voltage and current waveforms. Typically, a loaded printed circuit board is crowded with various electrical components, including multiple IC packages. Due to the close spacing of components on the board (i.e., high "board density") it is often difficult to electrically connect the ICs to the test instrument. BGAs tend to exacerbate this problem since there are no "leads to access for testing purposes.

As processor packages become more dense due to electrical requirements, it has become increasingly difficult to probe these packages. With pin counts in the 600–700 range, and pin to pin spacing now at 0.050 inches or less, it has become necessary for motherboard sockets to go to BGA style packages vs. the former pin grid array ("PGA") packages. This trend has increased the difficulty in reliably dividing and attenuating signals within the interstitial array of pins.

Also, increasing pin counts and pin densities increases the insertion force required to insert the processor into a conventional low insertion force socket. Typically, the collective insertion force required to insert a 603 pin processor is approximately 55–60 lbs. of force.

SUMMARY

The present invention provides a BGA-PGA-Flex probing system. Advantageously, the invention allows use of a user's pre-existing BGA socket while continuing to use a method of egressing signals from a PGA using flexible circuit material. The invention also allows replacement of a Low-Insertion Force ("LIF") socket with an adaptation of a user's BGA Zero-insertion Force ("ZIF") socket.

Accordingly, a user can easily insert a processor package into a probe according to the invention without damage to the silicon. The BGA-PGA-Flex probing system of the invention offers an electrically and mechanically superior interface to existing interposing probes for high-density processor packages. Advantageously, the current invention allows a user to utilize existing ZIF sockets. Implementation of a user's socket into the probing system of the invention makes processor bus simulations easier due to fact that a user will already have simulated the socket by itself. The invention also offers the advantage of a ZIF socket versus a LIF socket.

In a preferred embodiment, the present invention comprises an unsealed BGA socket, nail head pins which can be inserted flush into a pin carrier to produce a PGA header, a Flex circuit assembly comprising a piece of flexible circuit with various passive resistors and connectors attached and solder preforms used to solder the flex assembly to the pin grid array.

DETAILED DESCRIPTION

Figure 1:
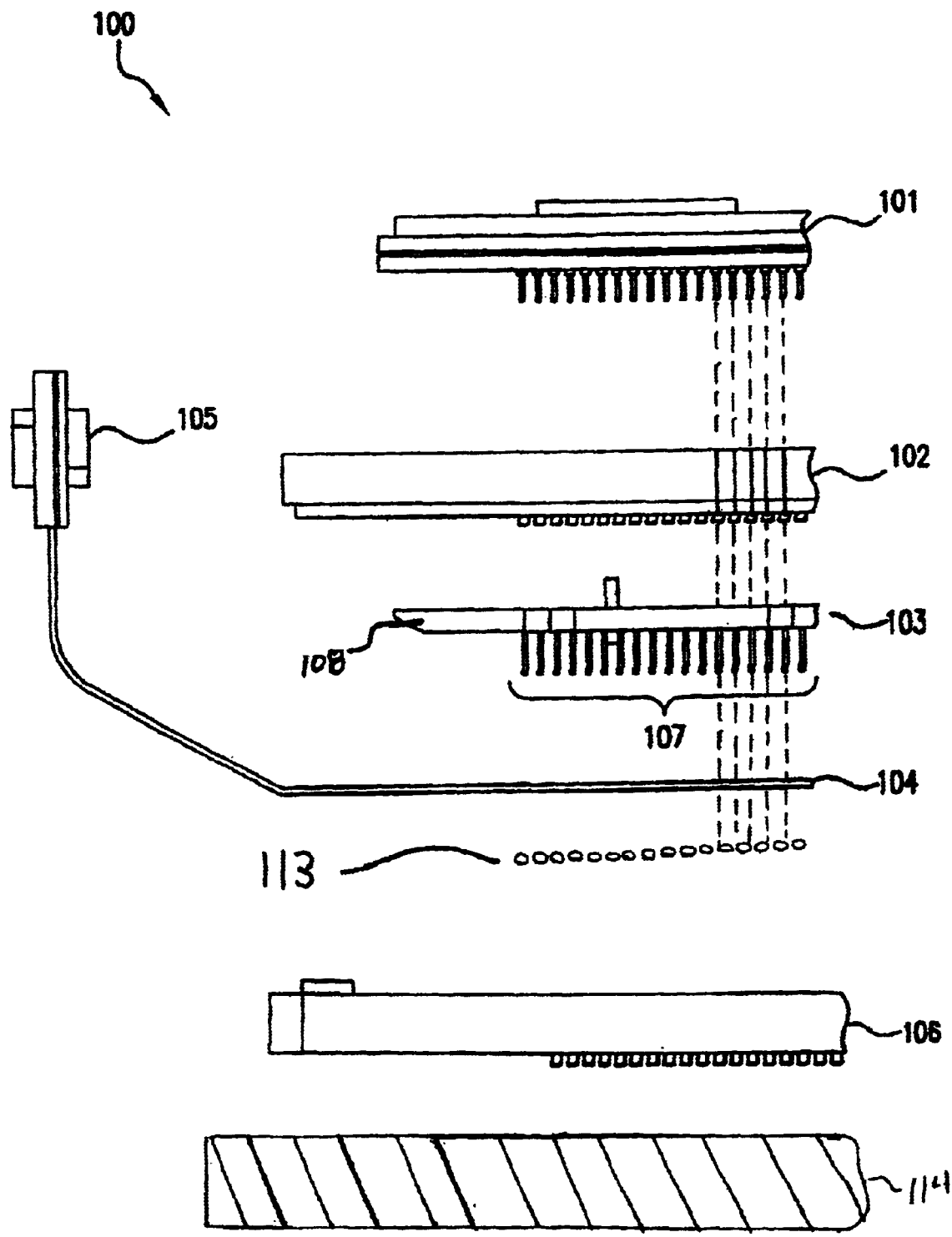
FIG. 1 is an exploded partial side view of a BGA-PGA-Flex probe in accordance with the invention.

FIG. 1 shows an exploded partial side view of of a BGA-PGA-Flex probe in accordance with the invention. Generally, the probe is interposed between an integrated circuit device and a printed circuit board. The probe assembly allows a user to access signals from the processor.

Referring now to FIG. 1, an exploded partial side view of a preferred embodiment of a BGA-PGA-Flex probe is shown. A microprocessor 101 that plugs into the top of the probe 100. The probe 100 comprises a BGA socket 102, a PGA header 103, a flexible circuit assembly 104, a matched impedance connector 105 soldered to the flexible circuit 104 and a motherboard ZIF socket 106 that is suited to plug into a motherboard 114.

The BGA socket 102 is a ZIF socket allowing a user to easily insert the processor 101 into the probe 100 without damaging the processor's 101 silicon. The PGA header 103 comprises a plurality of nail head pins 107 inserted flush into a pin carrier 108. Preferably, the plurality of nail head pins 107 comprise brass nails with gold over nickel plating. The gold over nickel plating is preferably 0.000010 inches gold over 0.000050 inches nickel. The flexible circuit assembly 104 comprises a flexible circuit with a variety of passive resistors and connectors attached (not shown). A plurality of solder preforms 113 are shown. During assembly of the probe, the solder preforms 113 are placed over each of the nail head pins 107 after they have been inserted through the flex circuit 104.

Figure 2:
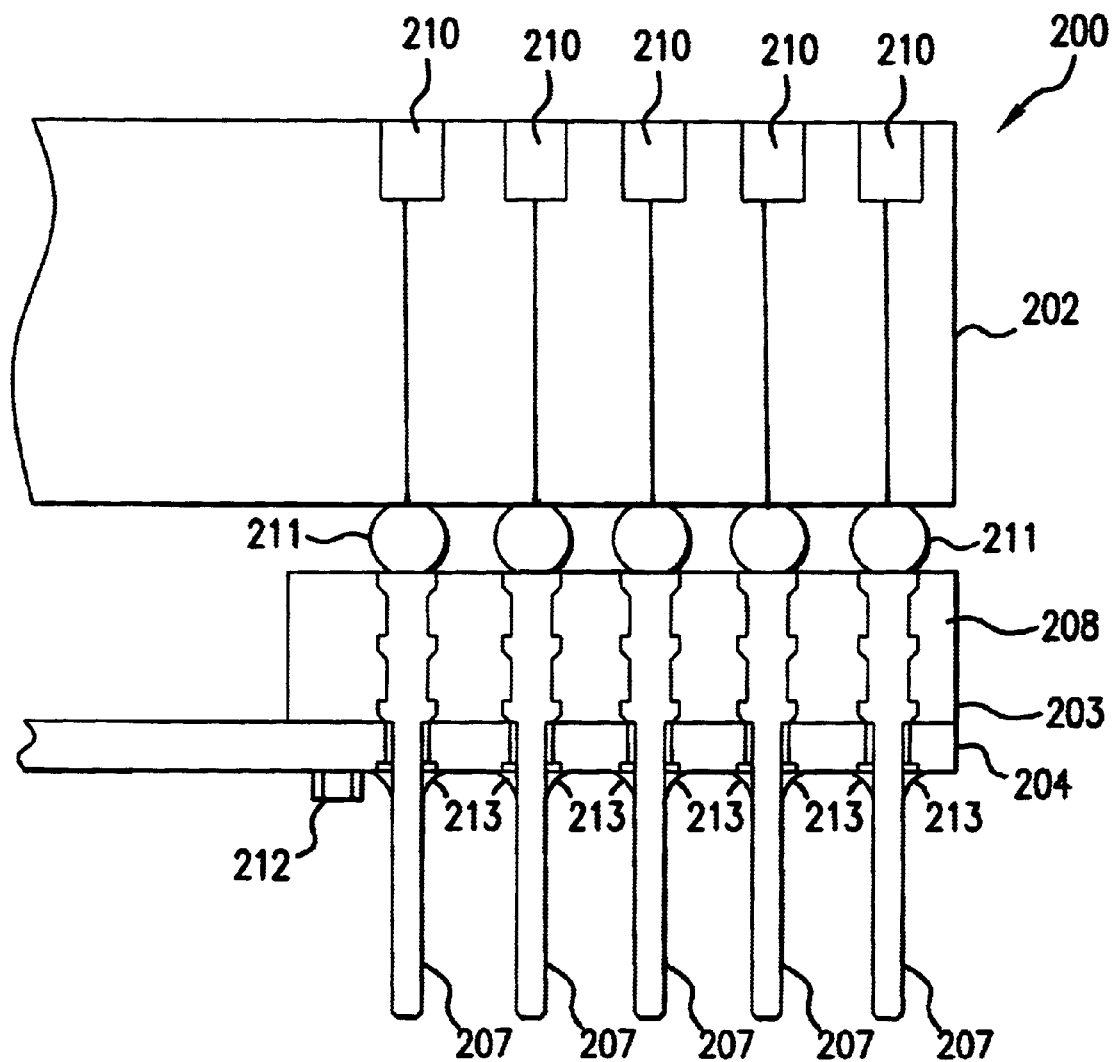
FIG. 2 is a partial view of a BGA-PGA-Flex probe in accordance with the invention.

Referring now to FIG. 2, a partial side view of a BGA-PGA-Flex probe is shown. The probe 100 comprises a BGA socket 102, a PGA header 103, a flexible circuit assembly 104, a matched impedance connector (not shown) soldered to the flex circuit 104 and a probe assembly plug (not shown). This is the same probe 100 as the probe 100 shown in FIG. 1 from a different angle.

Also shown in FIG. 2 are a plurality of socket plugs 110 in the top of the BGA socket 102, a plurality of BGA solder balls 111 attached to the plurality of nail head pins 107, an SMT resistor 112 and a plurality of solder preforms 113 which have been soldered to one side of the flexible circuit assembly 104. The socket plugs 110 are connected to the BGA solder balls 111. Not shown in FIG. 2 are the processor and the matched impedance connector soldered to the flexible circuit.

A processor (not shown) plugs into the top of the BGA socket 102. The BGA socket 102 is soldered to the PGA header 103 utilizing a soldering method called reflow. The plurality of nail head pins 107 extend through the pin carrier 108 to produce the PGA header 103. Preferably, the pin carrier 108 is an FR4 pin carrier. The flexible circuit assembly 104 is inserted over the plurality of nail head pins 107 and soldered thereto using solder preforms placed over each nail head pin 107. The flexible circuit is soldered to the PGA pins to produce a resistive divider for the signals coming out of the processor. The solder preforms are preferably a 63-37 solder material, which has a reflow temperature of 183° C.

The BGA socket 102 is preferably a ZIF socket allowing easy insertion of a processor (not shown) into the insertion holes 110 in the top of the socket 101. Also preferably, the plurality of nail head pins 107 are 0.012 inch diameter pins with 0.020 inch pin heads allowing proper reflow of the plurality of solder balls [2]111. The preferred composition of the plurality of nail head pins 107 is brass C3600, ASTM-B-16 with a 0.000010 inch gold over 0.000050 inch nickel plating. Also preferably, the flexible circuit 104 is a 0.017 inch thick multilayer flexible circuit. Also preferably, the resistor 112 is a 0201 resistor. A person skilled in the art will appreciate that the material, size, thickness and other characteristics of the components can vary in accordance with the method of the invention to achieve proper reflow and soldering of components.

In operation, referring still to FIG. 2, a processor (not shown in FIG. 2) is inserted into the BGA ZIF socket 102 on the interposing probe 100. The BGA socket 102 is actuated by depressing locking levers (not shown) which locks the processor into place. Matched impedance cables are attached to the matched impedance connectors (not shown in FIG. 2) which are soldered on the end of the flexible circuit assembly 104. The BGA-PGA-Flex probe 100 is inserted into the target system socket (not shown). The target system is preferably a motherboard ZIF socket. The target socket is actuated to lock the probe 100 into place. The probe 100 is connected to an electronic test instrument and the capturing of front side bus traces is enabled. The matched impedance connectors soldered to the flexible circuit enables connectivity of signals by matched impedance cables.

The BGA-PGA-Flex probing system provided by the invention enables a more flexible and efficient method of probing a BGA socket. As component density increases on users' target systems; it becomes increasingly important to make interposing probes smaller and more flexible.

While the method of the present invention has been illustrated and described in connection with the preferred embodiment, it is not to be limited to the particular structure shown.

What is claimed is:

1. An integrated probe assembly for electrically connecting an integrated circuit package to a test instrument, comprising:
    a single BGA socket;
    a single PGA header comprising a plurality of nail head pins and a pin carrier, said PGA header being soldered to said BGA socket;
    a flexible circuit assembly inserted onto said PGA header; and
    a plurality of solder preforms inserted over said plurality of nail head pins, said preforms having been reflowed.

2. The probe of claim 1, wherein said BGA socket is a ZIF socket.

3. The probe of claim 2, wherein said pin carrier is an FR4 carrier.

4. The probe of claim 3, wherein said flexible circuit assembly comprises a plurality of SMT components reflow soldered to a flexible circuit and a pair of matched impedance connectors soldered to said flexible circuit.

5. The probe of claim 4, wherein said solder preforms are 63-37 solder.

6. The probe of claim 2, wherein said probe is insertable into a mother board ZIF socket.

7. A system for probing bus trace signals from a processor, said system comprising:
    a single BGA ZIF socket;
    a single PGA header comprising a plurality of nail head pins and a pin carrier, said PGA header being soldered to said BGA socket;
    a flexible circuit assembly inserted onto said PGA header, said flexible circuit having a pair of matched impedance connectors soldered thereto; and
    a plurality of solder preforms inserted over said plurality of nail head pins, said preforms having been reflowed;
    wherein a processor is insertable into said BGA ZIF socket, said system is insertable into a motherboard ZIF socket and processor bus trace signals are capturable from said matched impedance connectors.

\* \* \* \* \*